United States Patent
Ku

(10) Patent No.: US 8,437,212 B2
(45) Date of Patent: May 7, 2013

(54) SEMICONDUCTOR MEMORY APPARATUS, MEMORY SYSTEM, AND PROGRAMMING METHOD THEREOF

(75) Inventor: Kie Bong Ku, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 96 days.

(21) Appl. No.: 12/968,168

(22) Filed: Dec. 14, 2010

(65) Prior Publication Data
US 2012/0106279 A1    May 3, 2012

(30) Foreign Application Priority Data

Oct. 29, 2010 (KR) .................. 10-2010-0106842

(51) Int. Cl.
*G11C 17/18* (2006.01)
*G11C 29/00* (2006.01)

(52) U.S. Cl.
USPC .............................. 365/225.7; 714/718

(58) Field of Classification Search .............. 365/201, 365/225.7
See application file for complete search history.

(56) References Cited

U.S. PATENT DOCUMENTS

| | | | |
|---|---|---|---|
| 6,324,105 B1 * | 11/2001 | Shirley | 365/200 |
| 6,801,048 B2 | 10/2004 | Farnworth et al. | |
| 7,272,757 B2 * | 9/2007 | Stocken | 714/718 |
| 7,376,025 B2 | 5/2008 | Merritt et al. | |
| 7,619,938 B2 * | 11/2009 | Co et al. | 365/201 |
| 2003/0117829 A1 | 6/2003 | Ronza et al. | |
| 2004/0165467 A1 | 8/2004 | Sasaki et al. | |

FOREIGN PATENT DOCUMENTS

| | | |
|---|---|---|
| JP | 2004-119458 | 4/2004 |
| JP | 2007-048394 | 2/2007 |
| JP | 4015025 B2 | 11/2007 |
| JP | 2008-107897 | 5/2008 |
| KR | 2000-0062452 A | 10/2000 |
| KR | 10-2003-0066074 A | 8/2003 |
| KR | 1020070082815 A | 8/2007 |
| KR | 1020090056259 A | 6/2009 |

* cited by examiner

*Primary Examiner* — Son Mai
(74) *Attorney, Agent, or Firm* — William Park & Associates Patent Ltd.

(57) ABSTRACT

Various embodiments of a semiconductor memory apparatus are disclosed. In one exemplary embodiment, the semiconductor memory apparatus includes a core block configured to receive and store external input data, a control unit configured to activate a control signal in response to a test mode signal and a command, when the external input data has a predetermined value, and a fuse circuit configured to perform fuse programming when the control signal is activated.

17 Claims, 3 Drawing Sheets

SEMICONDUCTOR MEMORY APPARATUS, MEMORY SYSTEM, AND PROGRAMMING METHOD THEREOF

CROSS-REFERENCES TO RELATED APPLICATION

The present application claims priority under 35 U.S.C. §119(a) to Korean Patent Application No. 10-2010-0106842, filed on Oct. 29, 2010 in the Korean Intellectual Property Office, which is incorporated herein by reference in its entirety as if set forth herein.

BACKGROUND

1. Technical Field

This disclosure generally relates to a semiconductor circuit, and more particularly to a semiconductor memory, a memory system, and a programming method thereof.

2. Related Art

A semiconductor circuit, for example, a semiconductor memory apparatus includes a fuse element for repairing a single bit fail. Such fuse element is called an anti-fuse, which is typical in the art.

The anti-fuse is electrically shorted through a programming operation from an electrically open state in its normal state, or operates vice versa, thereby repairing the single bit fail.

Such fuse programming may be performed with respect to a memory chip where fail has occurred before a memory module is configured for actual use.

A problem with typical semiconductor circuits is that, once a memory module is configured with a plurality of semiconductor memories, it is not possible to select a specific memory chip where fail has occurred and perform fuse programming with respect to the selected chip.

SUMMARY

Accordingly, there is a need for an improved semiconductor circuit that may obviate the above-mentioned problem. It should be understood, however, that some aspects of the invention may not necessarily obviate the problem.

In the following description, certain aspects and embodiments will become evident. It should be understood that these aspects and embodiments are merely exemplary, and the invention, in its broadest sense, could be practiced without having one or more features of these aspects and embodiments.

In one exemplary embodiment, a semiconductor memory apparatus includes: a core block configured to receive and store external input data; a control unit configured to activate a control signal in response to a test mode signal and a command, when the external input data has a predetermined value; and a fuse circuit configured to perform fuse programming when the control signal is activated.

In another exemplary embodiment, a memory system includes: a memory module including a plurality of semiconductor memories and configured to perform a selective fuse programming operation with respect to the plurality of semiconductor memories according to external input data; and a memory controller configured to provide the memory module with a command for the fuse programming operation and selectively provide the plurality of semiconductor memories with data having a predetermined value.

In another exemplary embodiment, a programming method of a memory system including a memory module having a plurality of semiconductor memories and a memory controller includes the steps of: testing whether a fail has occurred in the plurality of semiconductor memories; and selectively programming the plurality of semiconductor memories by the memory controller, according to a result obtained by testing whether the fail has occurred.

BRIEF DESCRIPTION OF THE DRAWINGS

The accompanying drawings, which are incorporated in and constitute a part of this specification, explain various embodiments consistent with the invention and, together with the description, serve to explain the principles of the invention.

DETAILED DESCRIPTION

Figure 1:
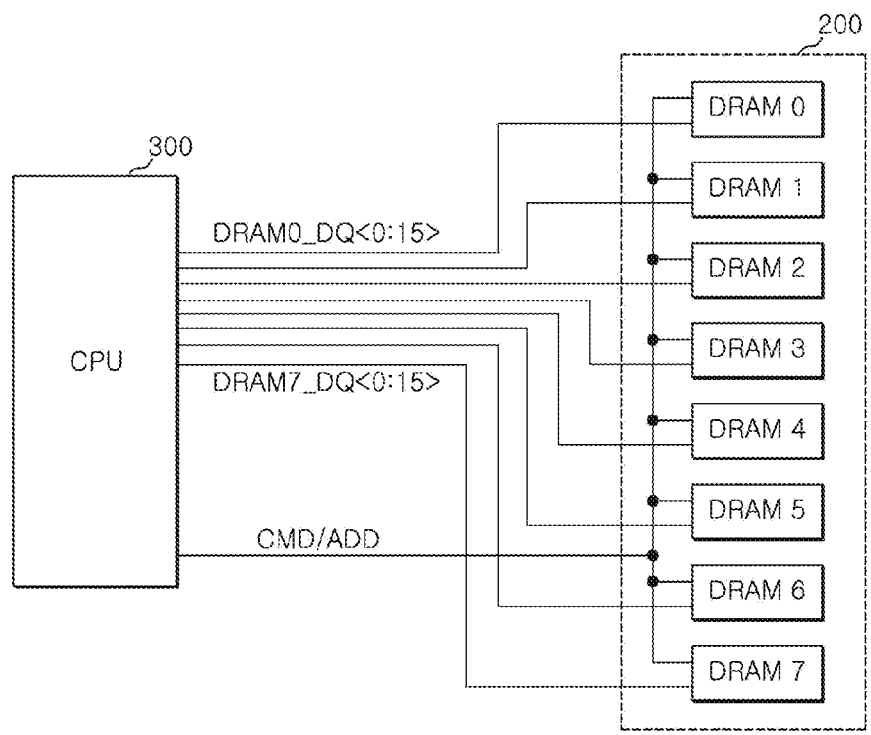
FIG. 1 is a block diagram illustrating the configuration of a memory system according to an exemplary embodiment of the invention.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a block diagram illustrating the configuration of a memory system according to an exemplary embodiment of the invention. Referring to FIG. 1, a memory system 100 according to an exemplary embodiment of the invention includes a memory module 200 and a memory controller 300, such as a central processing unit (CPU).

The memory module 200 may include a plurality of semiconductor memory apparatuses DRAM0 to DRAM7.

The plurality of semiconductor memory apparatuses DRAM0 to DRAM7 of the memory module 200 may be configured to perform a fuse programming operation according to data values inputted during a test mode period in response to an external command.

The memory controller 300 may be configured to selectively input data having a predetermined value to the plurality of semiconductor memory apparatuses DRAM0 to DRAM7 and provide the external command CMD for the fuse programming operation.

The plurality of semiconductor memory apparatuses DRAM0 to DRAM7 of the memory module 200 and the memory controller 300 may independently use data channels DRAM0_DQ<0:15> to DRAM7_DQ<0:15> and share a command/address channel CMD/ADD.

Figure 2:
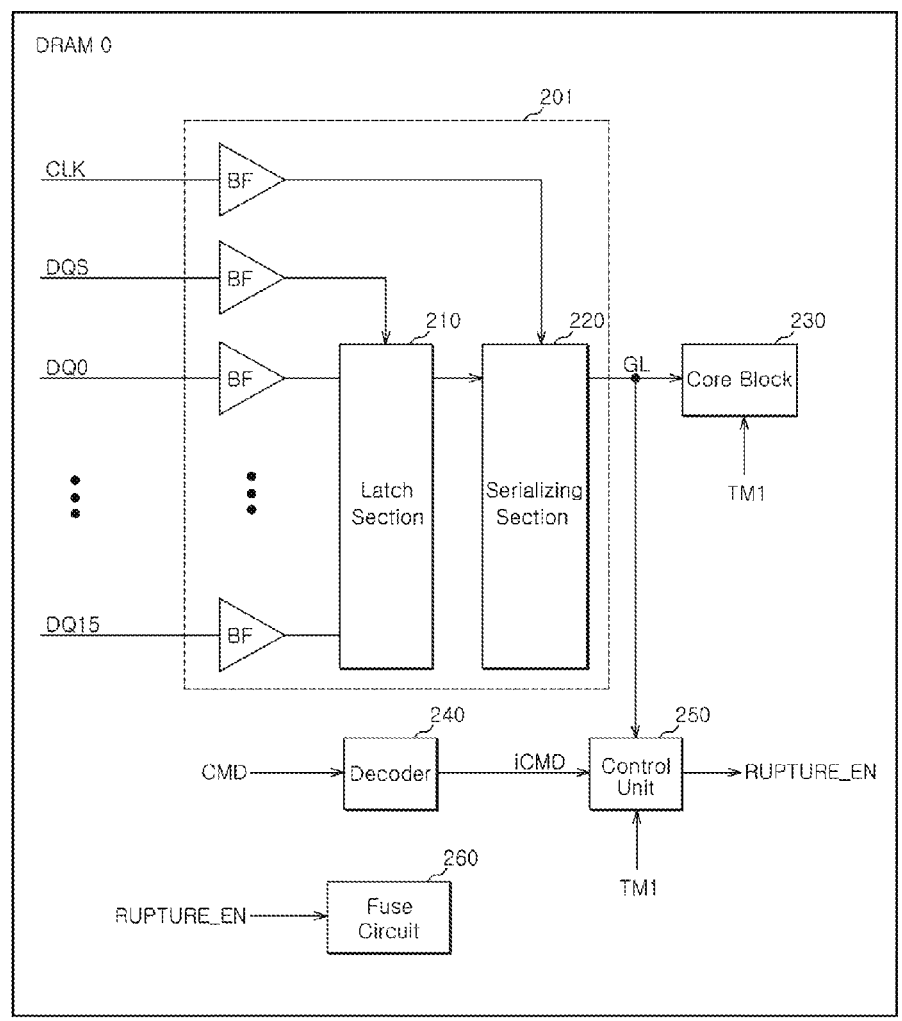
FIG. 2 is a block diagram illustrating the configuration of the semiconductor memory apparatus illustrated in FIG. 1.

FIG. 2 is a block diagram illustrating the configuration of the semiconductor memory apparatus illustrated in FIG. 1. Referring to FIG. 2, the semiconductor memory apparatus DRAM0 includes a data input unit 201, a core block 230, a decoder 240, a control unit 250, and a fuse circuit 260.

The data input unit 201 may be configured to process external input data in a storable form.

The data input unit 201 may include a plurality of buffers BF, a latch section 210, and a serializing section 220.

The plurality of buffers BF may be configured to receive a clock signal CLK, a data strobe signal DQS and data inputted through the data channels DRAM0_DQ<0:15>.

The latch section 210 may be configured to store the data in response to the data strobe signal DQS.

The serializing section 220 may be configured to convert the data stored in the latch section 210 into serial data in response to the clock signal CLK and output the serial data to a global line GL.

The core block 230 may include a memory area and a data input/output circuit, and may be configured to store the data transmitted through the global line GL in the memory area.

The core block 230 may be configured to stop a data storage operation when a test mode signal TM1 is activated.

The test mode signal TM1 may be generated based on a combination of a command and an address inputted through the command/address channel CMD/ADD.

The decoder 240 may be configured to decode the external command CMD and generate an internal command iCMD.

The control unit 250 may be configured to activate a control signal RUPTURE_EN in response to the test mode signal TM1 and the internal command iCMD when the data transmitted through the global line GL has a predetermined value.

The control unit 250 may be configured to recognize an internal command iCMD inputted in the state in which the test mode signal TM1 is activated as a command for fuse programming regardless of the type of the internal command iCMD, and activate the control signal RUPTURE_EN when the data has the predetermined value.

Accordingly, the internal command iCMD is not limited to a command for defining fuse programming and may include all types of commands for operating the semiconductor memory apparatus.

The control unit 250 may include an encoder.

The fuse circuit 260 may be configured to perform programming when the control signal RUPTURE_EN is activated.

The fuse circuit 260 may include a plurality of fuses, or anti-fuses.

When the control signal RUPTURE_EN is activated, the fuse circuit 260 selectively changes the plurality of fuses to an open or shorted state in response to external control. The external control may include an operation for changing the level of a voltage applied to a fuse selected from the plurality of fuses. A part of the plurality of fuses may be selected using an address.

Figure 3:
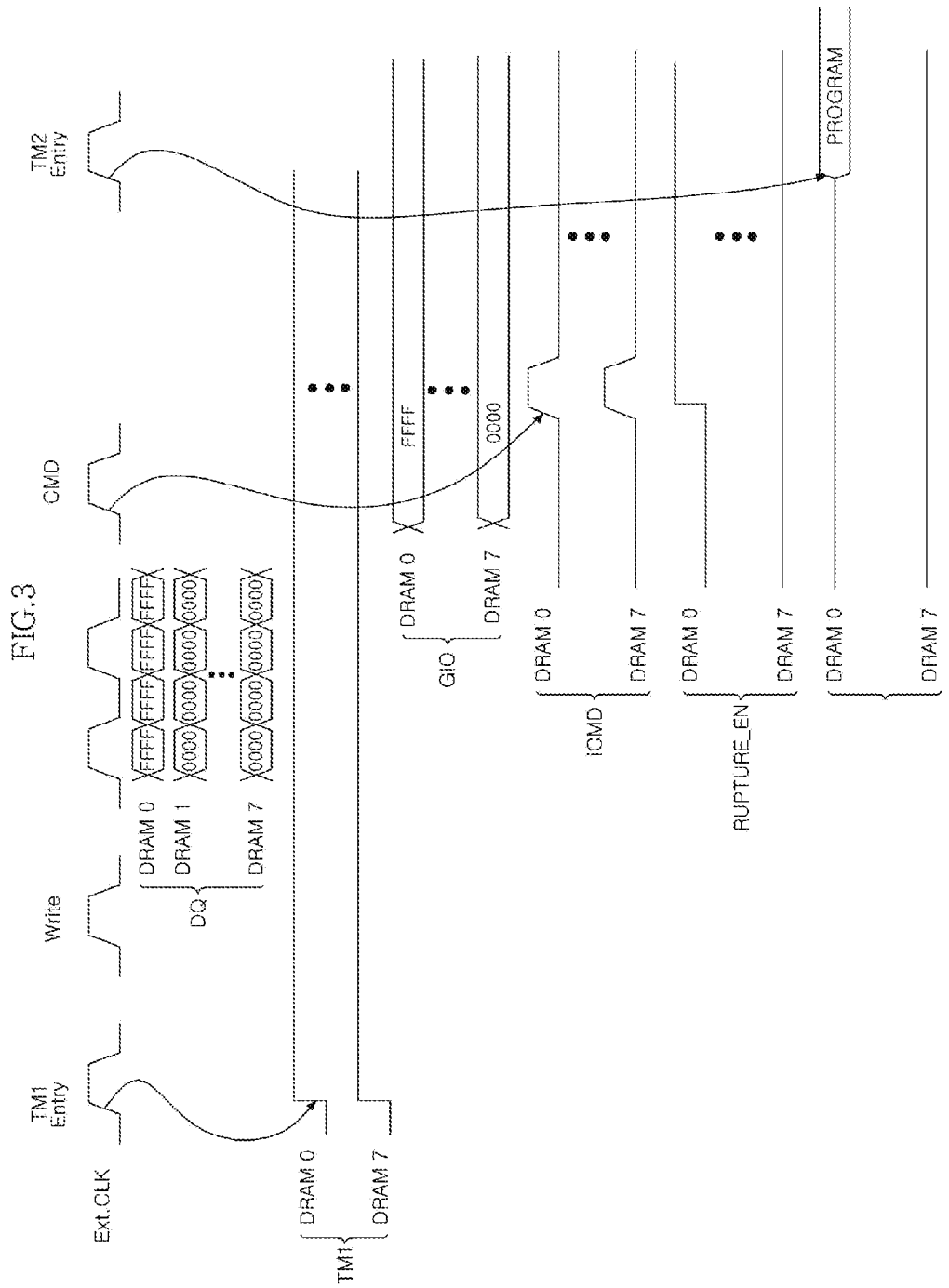
FIG. 3 is a timing diagram illustrating a programming method of a memory system according to an exemplary embodiment of the invention.

The operation of the memory system 100 having the above configuration will be described with reference to FIGS. 1 to 3.

The memory controller 300 operates the memory module 200 by receiving prescribed data and commands to search for a semiconductor memory apparatus where fail has occurred.

For the purposes of this example, it is assumed that a single bit fail has occurred in the semiconductor memory apparatus DRAM0.

The memory controller 300 inputs a command and an address for allowing the memory module 200 to enter a test mode to the memory module 200 through the command/address channel CMD/ADD.

The memory module 200 enters the test mode in response to the command and the address (TM1 entry).

At this time, the test mode signal TM1 is activated to a predetermined level, for example, a logic high level.

The memory controller 300 provides the memory module 200 with a write command Writ, a clock signal CLK, a data strobe signal DQS, and data DQ0 to DQ15.

The memory controller 300 provides the semiconductor memory apparatus DRAM0 where the fail has occurred with data having a predetermined value (for example, FFFF . . . ), and provides the other semiconductor memory apparatuses DRAM1 to DRAM7 with data having a value (for example, 0000 . . . ) different from the value of the data provided to the semiconductor memory apparatus DRAM0.

Each of the plurality of semiconductor memory apparatuses DRAM0 to DRAM7 may serialize data received through the data input unit 201 thereof and transmits serialized data to the global line GL.

As a result, data having the predetermined value (for example, FFFF) is loaded on the global line GL of the semiconductor memory apparatus DRAM0, which is different from the value of data loaded on the global lines GL of the other semiconductor memory apparatuses DRAM1 to DRAM7.

The memory controller 300 may provide the memory module 200 with a command CMD such as, for example, a command CMD for defining an active command.

The plurality of semiconductor memory apparatuses DRAM0 to DRAM7 of the memory module 200 may decode the command CMD to generate an internal command iCMD for defining the active command.

The control unit 250 of the memory module 200 activates the control signal RUPTURE_EN in response to the activated test mode signal TM1 and the internal command iCMD because the data loaded on the global line GL has the predetermined value (FFFF).

Meanwhile, the other semiconductor memory apparatuses DRAM1 to DRAM7 deactivate the control signal RUPTURE_EN regardless of the activated test mode signal TM1 and the internal command iCMD because the data loaded on the global line GL does not have the predetermined value (FFFF).

The fuse circuit 260 of the semiconductor memory apparatus DRAM0 is changed to a programmable state in response to the activated control signal RUPTURE_EN. For example, the fuses in the fuse circuit 260 are changed to a state in which they can receive a voltage for changing the states of the fuses.

Meanwhile, the other semiconductor memory apparatuses DRAM1 to DRAM7 substantially maintain a non-programmable state because the control signal RUPTURE_EN is in a deactivated state.

The memory controller 300 performs fuse programming for allowing the memory module 200 to enter another test mode (for example, a TM2) and repairing single bit fail.

The fuse programming may be performed using a combination of a command and an address and all the semiconductor memory apparatuses DRAM0 to DRAM7 receive a command and an address for the fuse programming.

However, since only the fuse circuit 260 of the semiconductor memory apparatus DRAM0 is in the programmable state, only the semiconductor memory apparatus DRAM0 is programmed in response to the command and the address for the fuse programming.

The above-described embodiment of the invention is limited to the fuse programming, but various applications can be made when employing a technological scope of selecting a desired semiconductor memory apparatus from a plurality of semiconductor memory apparatuses by using data.

While certain embodiments have been described above, it will be understood to those skilled in the art that the embodiments described are by way of example only. Accordingly, the semiconductor memory, the memory system, and the programming method thereof described herein should not be limited based on the described embodiments. Rather, the semiconductor memory, the memory system, and the programming method thereof described herein should only be limited in light of the claims that follow when taken in conjunction with the above description and accompanying drawings.

What is claimed is:

1. A semiconductor memory apparatus comprising:
   a core block configured to receive and store external input data;
   a control unit configured to activate a control signal in response to a test mode signal and an internal command, when the external input data has a predetermined value; and
   a fuse circuit configured to perform fuse programming when the control signal is activated.

2. The semiconductor memory apparatus according to claim 1, further comprising:
   a data input unit configured to process the external input data such that the external input data is stored in the core block; and
   a global line configured to transmit data outputted from the data input unit to the core block and the control unit.

3. The semiconductor memory apparatus according to claim 2, wherein the data input unit comprises:
   a latch section configured to store data in response to a data strobe signal; and
   a serializing section configured to convert the data stored in the latch section into serial data in response to a clock signal and output the serial data to the global line.

4. The semiconductor memory apparatus according to claim 1, wherein the core block is configured to stop a data storage operation when the test mode signal is activated.

5. The semiconductor memory apparatus according to claim 1, wherein the control unit is configured to recognize the command inputted in a state in which the test mode signal is activated as a fuse programming command regardless of a type of the command.

6. The semiconductor memory apparatus according to claim 1, wherein the fuse circuit includes a plurality of anti-fuses.

7. A memory system comprising:
   a memory module including a plurality of semiconductor memory apparatuses and configured to perform a selective fuse programming operation with respect to the plurality of semiconductor memory apparatuses according to external input data; and
   a memory controller configured to provide the memory module with a command for the fuse programming operation and selectively provide the plurality of semiconductor memory apparatuses with data having a predetermined value.

8. The memory system according to claim 7, wherein the memory controller is configured to provide the data having the predetermined value to a semiconductor memory apparatus, for which the fuse programming operation is to be performed among the plurality of semiconductor memory apparatuses, and provide data having a value different from the predetermined value to remaining semiconductor memory apparatuses.

9. The memory system according to claim 7, wherein the memory controller is configured to provide data to the plurality of semiconductor memory apparatuses in a state in which the memory module is allowed to enter a test mode.

10. The memory system according to claim 7, wherein the memory module includes a plurality of semiconductor memory apparatuses; an wherein each semiconductor memory apparatus comprises:
    a core block configured to receive and store the external input data;
    a control unit configured to activate a control signal in response to a test mode signal and the command when the external input data has the predetermined value; and
    a fuse circuit configured to perform fuse programming when the control signal is activated.

11. The memory system according to claim 10, wherein the core block is configured to stop a data storage operation when the test mode signal is activated.

12. The memory system according to claim 10, wherein the control unit is configured to recognize the command inputted in a state in which the test mode signal is activated as a fuse programming command regardless of a type of the command.

13. The memory system according to claim 10, wherein the fuse circuit includes a plurality of anti-fuses.

14. A method of programming a memory system including a memory module having a plurality of semiconductor memory apparatuses and a memory controller, comprising the steps of:
    testing whether a fail has occurred in the plurality of semiconductor memory apparatuses; and
    selectively programming the plurality of semiconductor memory apparatuses by using data having a predetermined value selectively provided by the memory controller, according to a result obtained by testing whether the fail has occurred.

15. The programming method according to claim 14, wherein the step of selectively programming the plurality of semiconductor memory apparatuses comprises:
    selectively providing, by the memory controller, the plurality of semiconductor memory apparatuses with the data having the predetermined value;
    providing, by the memory controller, the plurality of semiconductor memory apparatuses with a command after providing the data; and
    performing, by a semiconductor memory apparatus having received the data having the predetermined value among the plurality of semiconductor memory apparatuses, a programming operation in response to the command.

16. The programming method according to claim 15, wherein in the step of selectively providing, by the memory controller, the plurality of semiconductor memory apparatuses with data having the predetermined value, the data having the predetermined value is provided to a semiconductor memory apparatus for which the programming operation is to be performed among the plurality of semiconductor memory apparatuses, and data having a value different from the predetermined value is provided to remaining semiconductor memory apparatuses.

17. The programming method according to claim 15, wherein the command includes all types of commands for operating a semiconductor memory apparatus.

* * * * *